United States Patent
Ramaswami et al.

[11] Patent Number: 6,046,100
[45] Date of Patent: Apr. 4, 2000

[54] METHOD OF FABRICATING A FABRICATING PLUG AND NEAR-ZERO OVERLAP INTERCONNECT LINE

[75] Inventors: Seshadri Ramaswami, San Jose; Jaim Nulman, Palo Alto, both of Calif.

[73] Assignee: Applied Materials, Inc., Santa Clara, Calif.

[21] Appl. No.: 08/762,868

[22] Filed: Dec. 12, 1996

[51] Int. Cl.[7] .................................................. H01L 21/311
[52] U.S. Cl. ........................ 438/624; 438/638; 438/639; 438/739
[58] Field of Search ................................... 438/622, 623, 438/624, 637, 638, 639, 640, 713, 738, 739, FOR 492, FOR 458; 257/758, 759, 760, 774

[56] References Cited

U.S. PATENT DOCUMENTS

| | | | |
|---|---|---|---|
| 4,676,869 | 6/1987 | Lee et al. ................................. | 156/643 |
| 5,364,817 | 11/1994 | Lur et al. ................................. | 437/192 |
| 5,460,689 | 10/1995 | Raaijmakers et al. ................. | 156/643.1 |
| 5,698,112 | 12/1997 | Naeher et al. ............................ | 216/2 |
| 5,773,537 | 6/1998 | Shishiguchi ............................. | 438/479 |
| 5,874,357 | 2/1999 | Jun et al. ................................. | 438/638 |

FOREIGN PATENT DOCUMENTS

| | | | |
|---|---|---|---|
| 1-286442 | 11/1989 | Japan ............................ | 438/FOR 492 |
| 95/28000 | 10/1995 | WIPO . | |

OTHER PUBLICATIONS

"Method of Anchoring Contact or Via Plugs by Producing Lateral Recess in ILD or IMD Films", IBM Tech. Disc. Bull., vol. 38, No. 6, Jun. 1995, pp. 405–407.

S.M. Rossnagel & J. Hopwood, "Metal ion deposition from ionized magnetron sputttering discharge," Jan./Feb. 1994, J. Vac. Sci. Technol. B 12 (1), pp. 449–453.

*Primary Examiner*—T. N. Quach
*Attorney, Agent, or Firm*—Robert J. Stern

[57] ABSTRACT

A method of fabricating an electrically conductive plug on a semiconductor workpiece. A dielectric layer is deposited on the workpiece, and a cavity is etched in the dielectric. An etchant-resistant material is deposited on the wall of the cavity adjacent the cavity mouth so as to form an inwardly-extending lateral protrusion, the etchant-resistant material being resistant to etching by at least one etchant substance which etches said electrically conductive material substantially faster than it etches the etchant resistant material. The cavity is filled by an electrically conductive material. In another aspect of the method, the etchant-resistant material can be omitted. Instead, upper and lower portions of the cavity are etched anisotropically and isotropically, respectively, so as to form a lower portion of the cavity that is wider than the upper portion. In a third aspect of the method, a higher density upper layer of dielectric is deposited over a lower density lower layer of dielectric. The two layers are etched to form a cavity. Because of the upper layer's higher density, it etches more slowly than the lower layer, producing a cavity having an upper portion that is narrower than its lower portion.

17 Claims, 6 Drawing Sheets

METHOD OF FABRICATING A FABRICATING PLUG AND NEAR-ZERO OVERLAP INTERCONNECT LINE

FIELD OF THE INVENTION

The invention relates generally to methods of fabricating semiconductor integrated circuits, and, more specifically, to methods of fabricating a vertically-extending metal plug connected to a horizontally-extending metal interconnect line.

BACKGROUND OF THE INVENTION

Figure 1:
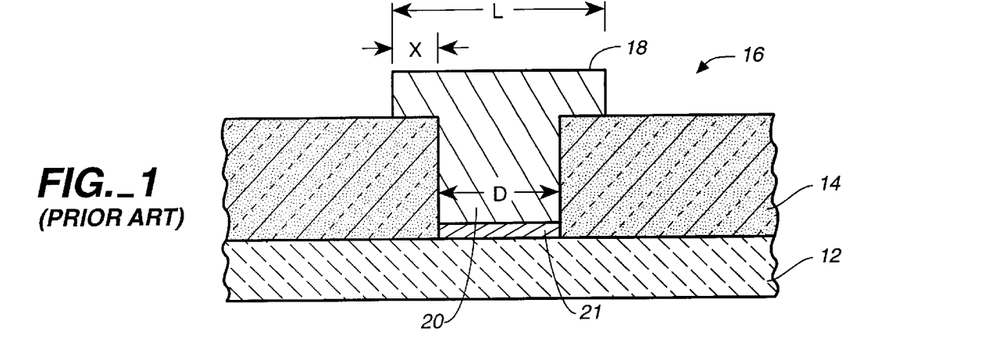
FIG. 1 is a sectional view of a conventional plug and interconnect line in an integrated circuit.

Referring to FIG. 1, a semiconductor integrated circuit generally has a structure consisting of a substrate on which a number of layers are fabricated. Lowermost are one or more semiconductor layers 12 in which a plurality of semiconductor devices and other electronic devices are fabricated. Next is a dielectric layer 14, followed by an interconnect layer or metallization layer 16. (Integrated circuits often include a number of alternating dielectric and metallization layers, but only one is shown here for sake of illustration.)

The interconnect layer 16 includes a plurality of interconnect lines or conductor lines 18 whose function is to electrically connect a first device on the semiconductor layer 12 to a second such device. A plug 20 extends vertically through the dielectric layer 14 to electrically connect the first device to the interconnect line 18. The interconnect lines 18 and plugs 20 are fabricated of a material having high electrical conductivity, typically metal or doped semiconductor material.

After the semiconductor devices are fabricated in the semiconductor layer 12, the remaining layers typically are fabricated by the following steps. First, a layer of dielectric 14 is deposited to cover the entire surface of the semiconductor layer 12. Second, a vertical hole called a "via" is etched in the dielectric at each location where a plug is to be created. Third (optional), an extremely thin barrier layer and/or wetting layer 21 is deposited in each via. Fourth, a metal or other conductive material is deposited to fill each via to form the plugs 20. Fifth, a blanket layer of metal or other conductive material is deposited over the substrate. The fourth and fifth steps may be performed as a single deposition step. Sixth, resist material is deposited and patterned over the blanket conductive layer so as to cover the areas of the conductive material which are to become the interconnect lines. Finally, the blanket conductive layer is etched to remove the conductive material from all surfaces not covered by resist, thereby creating the interconnect lines.

Figure 2A:
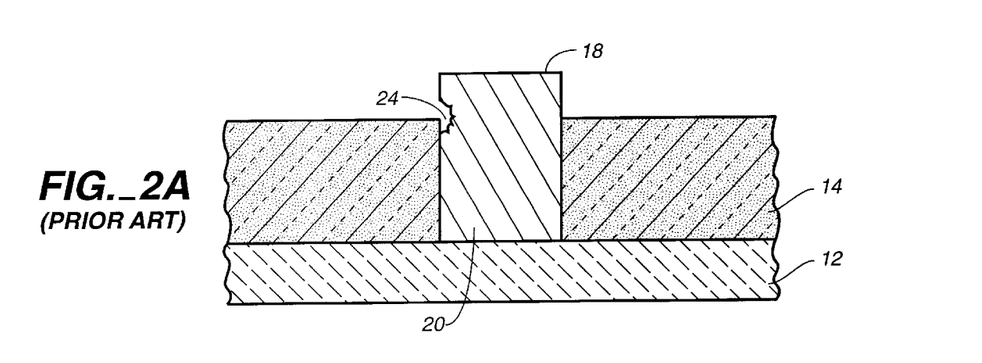
FIG. 2A is a sectional view of a conventional "zero overlap" interconnect line over a plug having a void.
Figure 2B:
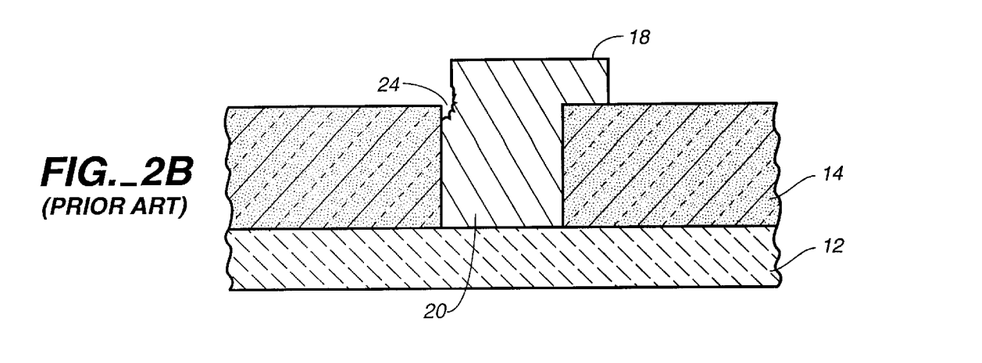
FIG. 2B is a sectional view of a conventional interconnect line overlapping the dielectric surrounding a plug, where the plug has a void due to misalignment of the interconnect line relative to the plug.

A problem with conventional processes for forming an interconnect line is that the process of etching the edge 22 of the interconnect line can undesirably etch part of the plug 20, creating a void 24 in the plug as shown in FIGS. 2A and 2B. Such voids can be created when the etching process is continued too long (see FIG. 2A), or when the interconnect line is misaligned relative to the plug so that one edge 22 of the interconnect line is too close to, or fails to overlap, the adjacent edge of the plug (see FIG. 2B).

The risk of creating voids caused by over-etching or misalignment is highest if the interconnect line is no wider than the plug, i.e., a "zero overlap" interconnect, as shown in FIG. 2A. However, "zero overlap" interconnect lines are desirable to maximize the density of components on an integrated circuit. Therefore, methods have been developed to prevent voids in plugs beneath "zero overlap" interconnects.

One conventional method of preventing the interconnect etch process from etching into the plug is to fabricate the plug and interconnect lines of different materials. The edge of the interconnect then can be chemically etched using an etchant which does not significantly etch the plug material. Specifically, plugs and interconnect lines conventionally are fabricated of tungsten and aluminum, respectively. Chlorine is much more reactive with aluminum than with tungsten. Therefore, the edges of the aluminum interconnects can be etched with chlorine without significantly etching the tungsten plugs.

However, the method described in the preceding paragraph is disadvantageous in at least two respects. One disadvantage is that it precludes using the best conductor material for both the plugs and the interconnects. Specifically, aluminum is the preferred material for both the plugs and the interconnect lines because aluminum has a higher conductivity (lower resistivity) than other materials conventionally used for fabricating plugs, such as tungsten. Another disadvantage is that the contact between two different plug and interconnect materials can be unreliable.

When both the plugs and the interconnect lines are fabricated of the same material, such as aluminum, a conventional method of preventing the interconnect etch process from creating a void in the plug is to compromise the goal of "zero overlap" interconnect lines. Specifically, the interconnect lines are fabricated with extra width (labelled as "X" in FIG. 1) overlapping the dielectric on all sides of the plug, so that a certain amount of excessive etch time or misalignment between the interconnects and the plugs can be tolerated without etching into the plug. Of course, a disadvantage of this method is that the overlap "X" wastes space on the integrated circuit, thereby reducing the number of semiconductor devices which can be fabricated on an integrated circuit having a given surface area.

SUMMARY OF THE INVENTION

The invention is an integrated circuit including an electrically conductive plug having a narrow neck, and a method of fabricating such plug and an overlying interconnect conductor. The invention prevents the etching of the interconnect from creating a void in the plug. The plug is fabricated by creating in the dielectric layer a cavity or via having an inwardly-extending lateral protrusion near the mouth of the cavity. The overlying interconnect is created by depositing a layer of conductive material and then etching the layer on two opposing sides of the plug. During etching of the layer, the protrusion advantageously prevents any etching of the metal plug beyond the protrusion, thereby preventing the etching from creating voids in the plug.

The invention permits the overlying interconnect to be fabricated more narrowly, i.e., with less overlap over the dielectric surrounding the plug, thereby improving the density of the integrated circuit.

The invention is particularly advantageous when the plug an interconnect are fabricated of the same conductive material, such as aluminum.

DETAILED DESCRIPTION OF THE PREFERRED EMBODIMENTS

1. Process Overview

FIG. 3 illustrates the steps of fabricating a plug and overlying conductor or interconnect line according to our invention.

Before performing the steps of the invention, it is assumed that a number of semiconductor devices have been fabricated in a semiconductor layer 12 on a workpiece such as a silicon wafer. Step 1 of the invention (FIG. 3A) is depositing a dielectric layer 14 over the semiconductor layer. Any conventional dielectric deposition process is suitable for performing this step. The dielectric layer 14 can be a single layer deposited in a single step, or multiple layers deposited in successive steps using different deposition process parameters. The currently preferred dielectric material for deposition on a silicon wafer is silicon dioxide.

Step 2 (FIG. 3B) is creating one or more cavities 30 which extend through the dielectric layer 14 to the semiconductor layer 12. In our invention, each cavity 30 includes a protrusion 32 in the cavity neck 40, i.e., in the cavity side wall just below the cavity mouth 34. The protrusion may be created subtractively or additively. In a subtractive embodiment of the invention, the cavity is etched by a process that etches more dielectric material from the base of the cavity than from the top, so that un-etched dielectric material just below the mouth of the cavity constitutes the protrusion. Etching methods for creating the protrusion will be described below. In an additive embodiment, the cavity is etched without a protrusion, and then the protrusion is deposited, preferably using the ECR ionized sputter deposition process described below.

Step 3 (also shown in FIG. 3B) is depositing a very thin barrier layer 21 on the bottom of each cavity 30. As in conventional plug fabrication processes, the barrier layer inhibits diffusion into the silicon layer 12 of atoms of the subsequently deposited conductive plug 20. Step 3 is optional, but typically preferred. Step 3 can be performed concurrent with, or subsequent to, Step 2, as will be described in more detail below.

Step 4 (FIG. 3C) is depositing metal or other conductive material so as to fill each cavity 30 with the metal and cover the dielectric top surface 38 with the metal. After this step, the metal filling each cavity 30 constitutes a plug 20, and the metal covering the dielectric constitutes an interconnect layer 16. The currently preferred metal material is aluminum because of its high electrical conductivity. The metal can be deposited by any conventional deposition process suitable for filling the cavity 30 without creating a void. Preventing voids is especially critical if the cavity 30 has a high aspect ratio (i.e., high ratio of depth to width).

Step 5 (FIG. 3D) is removing metal from opposing sides 42 of the mouth 34 of the plug 20 so as to leave a horizontally extending conductor or interconnect line 18 on the top surface 38 of the dielectric 14. This step can be performed by any etch process conventionally used for creating interconnect lines. In FIG. 3D, the resulting interconnect line 18 extends perpendicular to the plane of the drawing sheet.

2. Protrusion in Cavity Wall

In prior art plug fabrication processes, the final etch step corresponding to our Step 5 (FIG. 3D) can produce a void 24 in the plug 20 (as shown in FIG. 2) due to any of at least two sources of inaccuracy in the etch step. One potential inaccuracy is that the etch process is not terminated soon enough, so that the edges of the interconnect line 18 overlying the plug are etched to a width less than the width of the mouth 34 of the plug. Another potential inaccuracy is that the photolithography mask that defines the location of the interconnect line (i.e., the mask that defines the portion of the metal layer 16 which will be covered by resist during the etch step) can be laterally misaligned relative to the mask used in Step 2 (FIG. 3B) to locate the plug cavity 30. Such misalignment is illustrated in FIG. 2.

To prevent the final etch step from producing such voids, in our invention the inwardly-extending lateral protrusion 32 in the top or "neck" portion 40 of the cavity 30—i.e., in the side wall of the cavity just below the cavity mouth 34—prevents the metal plug 20 from being etched even if the metal interconnect line 18 is etched more than intended and even if the interconnect line is misaligned relative to the plug. Specifically, a void will not be created in the plug if both outer edges 22 of the interconnect line 18 are outside the corresponding inner edges of the underlying protrusions 32.

In quantitative terms, suppose we define a quantity A as the cumulative or total error in the lateral position of one interconnect edge 22 relative to the cavity mouth 34, due to such factors as excessive etching of the interconnect 18 and misalignment of the interconnect mask relative to the plug mask, as just discussed. Additionally, define X as the nominal overlap of the edge 22 of the interconnect line beyond the width of the plug 20, where "nominal" means the amount of overlap when errors due to manufacturing tolerances are zero. In other words, the lateral width L of the interconnect line exceeds the diameter or width D of the cavity by 2X. (See FIGS. 1, 3B, and 3D.)

A void will not be created if the cumulative error $\Delta$ is less than the sum of the lateral width "W" of the protrusion 32 and the nominal overlap X of the interconnect line. Therefore, in choosing the parameters of the previously described fabrication process, the width W of the protrusion (established in process Step 2) and the nominal overlap X of the interconnect (established in process Step 5) preferably should be chosen so that their sum equals or exceeds the maximum likely cumulative error $\Delta$ in the lateral position of the interconnect edge 22.

In other words, the overlap X of the interconnect required to prevent formation of a void in the plug is reduced by the width W of the protrusion in the cavity side wall. If the protrusion width W equals or exceeds the likely cumulative error $\Delta$ in the lateral position of the interconnect edge, then the interconnect can be fabricated with zero overlap X while still avoiding the formation of voids.

In the example shown in FIG. 3D, the width or diameter of the plug 20 is 0.3 micron, and the width W of the protrusion 32 is 0.05 micron (500 Å), so that the narrowest portion of the plug (i.e., the portion surrounded by the protrusion) has a width or diameter of 0.2 micron. If the interconnect line has zero overlap X—i.e., if the width of the interconnect line equals the 0.3 micron maximum width D of the plug—the protrusion will prevent the formation of a void in the plug 20 so long as the cumulative lateral error Δ in the position of the interconnect line 18 is less than 0.05 micron.

The optimum width W of the protrusion 32 is a balance between two opposing considerations. As just explained, increasing the width W reduces the risk of creating voids during the etching of the interconnect lines 18 in Step 5. However, if the width W is too great, the mouth 34 of the cavity will become so small that it will be hard to completely fill the cavity 30 with metal in Step 4, the metal deposition step. If a portion of the cavity is not filled with metal, the likely result is a void inside the cavity. Therefore, the optimum value of the width W is a balance between preventing voids during the etching of Step 5 and preventing voids during the deposition of Step 4. This optimum value can be determined empirically. It is expected to depend on the etch and deposition processes being used and the dimensions of the plugs and interconnects being fabricated on the workpiece.

3. Methods of Depositing Conductive Material for Plug and Interconnect

The "Process Overview" section of this patent specification described a five step process for fabricating a plug and interconnect according to the present invention. Step 4 of that process (FIG. 3C) is depositing metal or other conductive material so as to fill each cavity 30 with the metal and cover the dielectric top surface 38 with the metal. Upon completion of Step 4, the metal filling each cavity 30 constitutes a plug 20, and the metal covering the dielectric constitutes an interconnect layer 16. The currently preferred metal material is aluminum because of its high electrical conductivity.

Step 4 (FIG. 3C) can be any conventional process for depositing the preferred metal (or other electrically conductive material) so as to fill the cavity 30 with the metal without creating a void. Preventing voids is more challenging if the cavity 30 has a high aspect ratio (i.e., high ratio of depth to width). We now will describe three alternative metal deposition processes which are especially suitable for Step 4 (FIG. 3C) because they can fill high aspect ratio cavities without creating voids.

In the first alternative category of deposition process, the metal is deposited isotropically in the cavity 30 as well as on the top surface 38 of the dielectric 14, but process conditions promote migration of deposited metal into the cavity from adjacent areas of the dielectric top surface. Such processes include high pressure sputter deposition and sputter deposition with reflow.

In the second alternative category of metal deposition process suitable for Step 4 (FIG. 3C), the metal deposition is highly directional (i.e., anisotropic), so that more metal deposits on horizontal surfaces than vertical surfaces. Conventional anisotropic metal deposition processes suitable for filling high aspect ratio holes include collimated sputter deposition, ionized sputter deposition, and selective chemical vapor deposition. Preferably, after the cavity is filled using an anisotropic deposition process, a conventional isotropic "blanket" deposition process can be used to deposit additional metal on the metal layer 16.

Figure 3A:
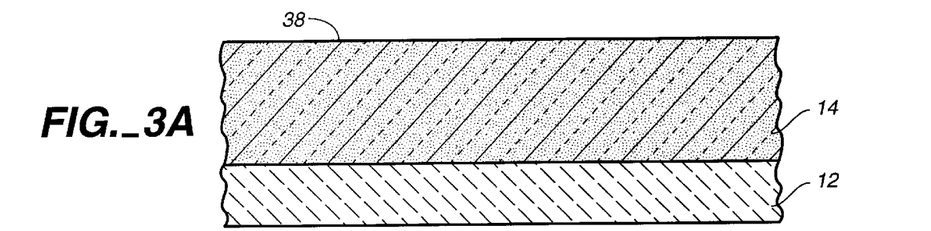
FIGS. 3A–3D show a sectional view of a plug and interconnect line at successive stages of the fabrication process of the invention.
Figure 3B:
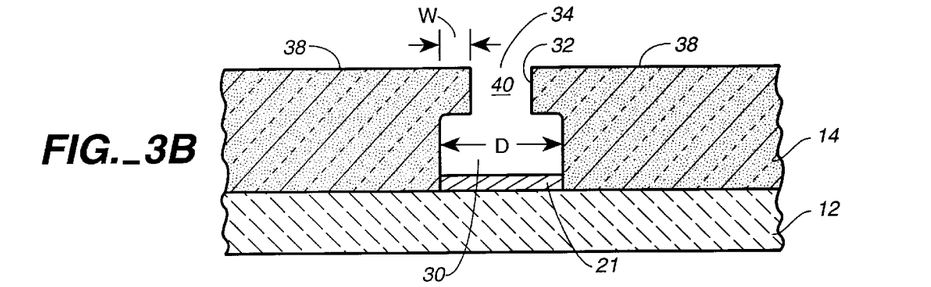
Figure 3C:
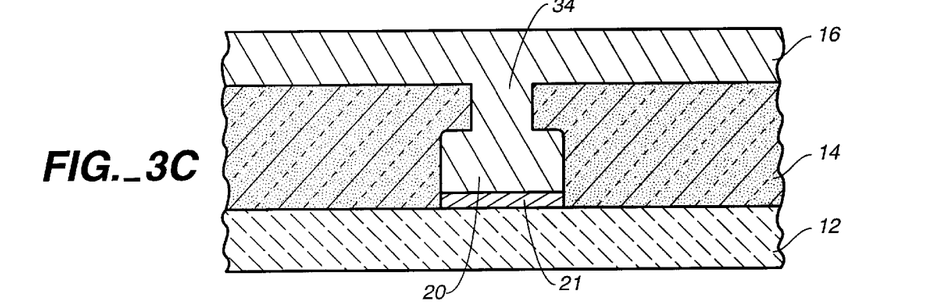
Figure 3D:
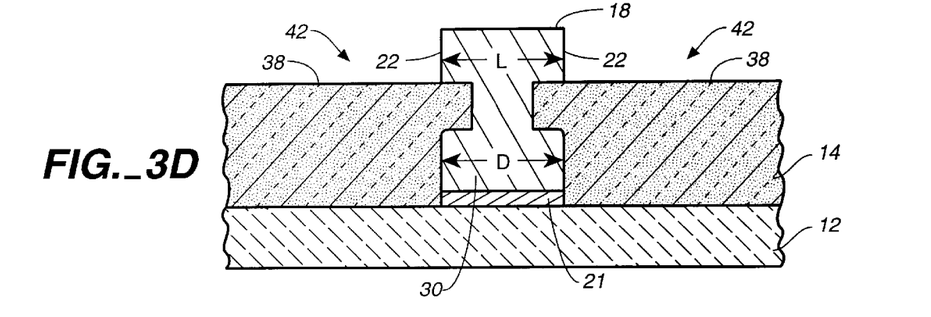
Figure 4A:
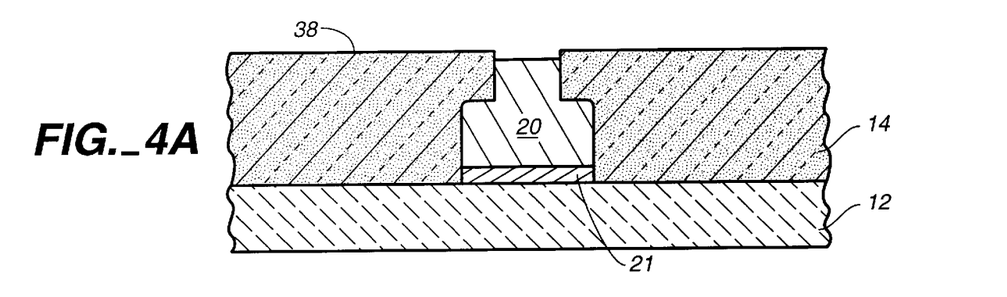
FIG. 4A is a sectional view of a plug fabricated by selective CVD.
Figure 4B:
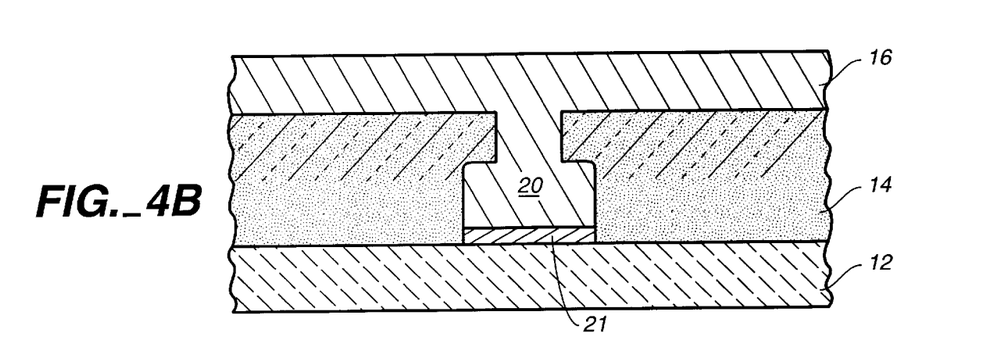
FIG. 4B is a sectional view of conductor material subsequently deposited over the surface of the integrated circuit.

The third alternative category of metal deposition process suitable for Step 4 is a selective chemical vapor deposition (selective CVD) process having two sub-steps, shown in FIG. 4, which replace the single Step 4 shown in FIG. 3C. In the first sub-step (FIG. 4A), the cavity is filled using a conventional selective CVD process which selectively favors deposition on the material of the barrier layer 21 and disfavors deposition on the material of the dielectric 14. Consequently, the first sub-step deposits metal in the cavity 30, thereby creating the plug 20, but does not deposit appreciable metal on the upper surface 38 of the dielectric 14. In the second sub-step (FIG. 4B), the metal layer 16 is deposited on the upper surface 38 by a conventional isotropic "blanket" deposition process.

If the optional Step 3 (see "Process Overview", above) is omitted so that no barrier layer 21 is deposited, then the conventional selective CVD process employed in the first sub-step should be one which selectively favors deposition on the semiconductor layer 12 instead of the barrier layer 21. Different selective CVD processes are well known which are selective in favor of different semiconductors and barrier materials.

4. Methods of Fabricating Protrusion in Cavity Wall

The "Process Overview" section of this patent specification described a five step process for fabricating a plug and interconnect according to the present invention. Step 2 of that process (FIG. 3B) is fabricating a cavity 30 whose mouth 34 has an inward protrusion 32. We now will describe various alternative methods for performing the aforesaid Step 2.

Figure 5:
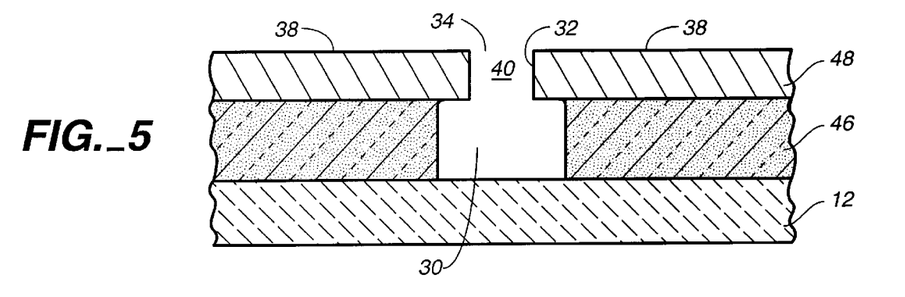
FIG. 5 is a sectional view of a cavity having the protrusion of the invention fabricated by depositing lower and upper dielectric layers having high and low etch rates, respectively, and then etching the cavity.

FIG. 5 illustrates one method of fabricating the protrusion 32. This method requires a modification to Step 1. Specifically, in Step 1 the dielectric 14 is deposited in two layers: a lower layer 46 having a relatively high etch rate and an upper layer 48 having a relatively low etch rate. During the subsequent Step 2 in which the cavity 30 etched, the slower etch rate of the upper layer will cause it to etch laterally less than the lower layer, thereby producing the desired protrusion at the upper layer.

One characteristic that affects etch rate is density. Specifically, one method of depositing lower and upper layers 46, 48 so that their etch rates are relatively high and low, respectively, is to deposit the two layers 46, 48 with different process parameters which cause the upper layer 48 to be denser than the lower layer 46. Dielectric CVD process parameters which are well known to affect the density of the deposited dielectric film include: RF power, chamber pressure, respective partial pressures of process reagents, argon bombardment, and dopants in the dielectric (either included in the process gas mixture during deposition, or subsequently implanted in the dielectric film).

Figure 6A:
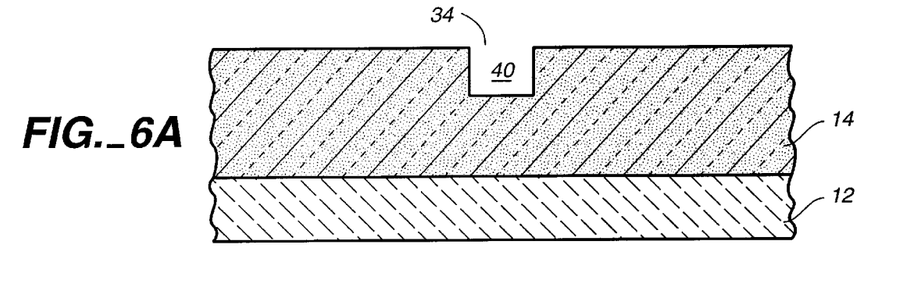
FIGS. 6A and 6B show a sectional view of two stages of fabricating a cavity having the protrusion of the invention by means of an anisotropic etch step followed by an isotropic etch step.
Figure 6B:
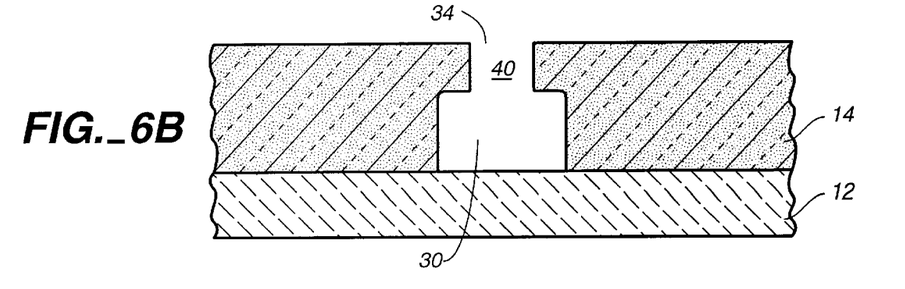

FIG. 6 illustrates an alternative method of performing Step 2, i.e., fabricating a cavity 30 having a protrusion 32. In this alternative, the dielectric 14 is deposited in Step 1 as a single, uniform layer (FIG. 3A), but then the Step 2 etching (FIG. 3B) is performed in two sub-steps. In the first sub-step, illustrated in FIG. 6A, the top or "neck" portion 40 of the cavity 30 just below the cavity mouth 34 is etched using a conventional anisotropic etch process which minimizes lateral etching by depositing a passivation layer on the sidewall of the cavity 30 as the cavity is being etched. In the second sub-step, shown in FIG. 6B, the remaining (lower) portion of the cavity is etched using a conventional etch process which is relatively isotropic and which deposits little or no passivation layer on the sidewall. During the second sub-step, the passivation layer previously deposited on the sidewall of the cavity neck will continue to impede lateral etching, thereby creating the desired protrusion 32.

The foregoing methods for performing Step 2—i.e., for creating a cavity 30 having a protrusion 32—are all subtractive, in that the protrusion is the dielectric material that remains after the remainder of the cavity 30 has been etched away. In contrast, FIG. 7 illustrates an additive method of performing Step 2 as two sub-steps: first an etch sub-step, followed by a deposition sub-step.

Figure 7A:
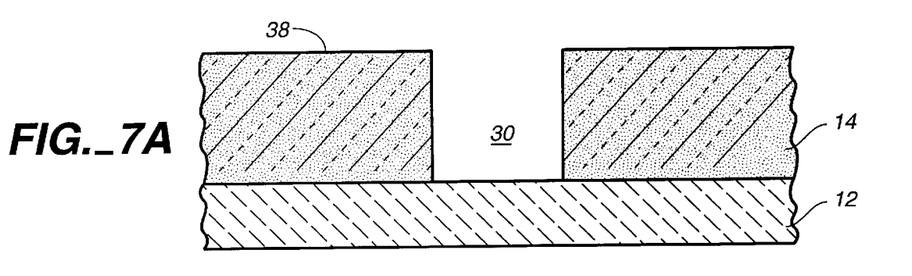
FIGS. 7A–7E show a sectional view of a plug and interconnect line at successive stages of a fabrication process in which the protrusion at the mouth of the cavity is deposited by PVD.

The first sub-step, shown in FIG. 7A, is to etch a conventional via cavity 30 having vertical side walls with no protrusion using a conventional etch process.

Figure 7B:
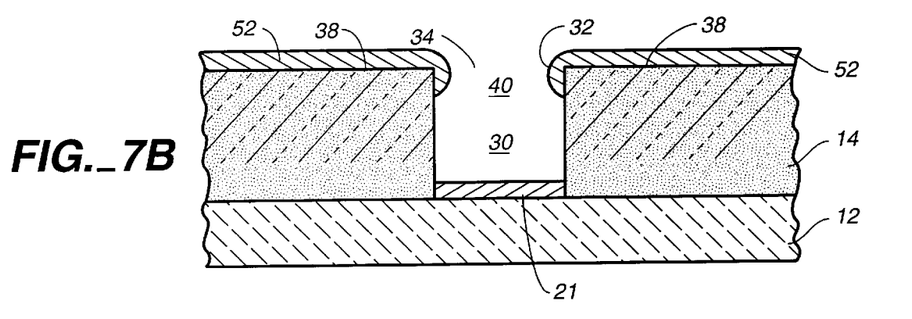
Figure 7C:
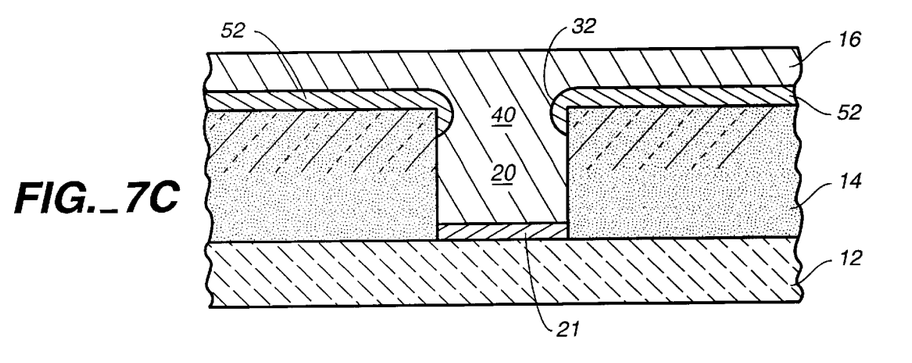

The second sub-step, shown in FIG. 7B, is to deposit a convex-shaped layer or protrusion 32 of etchant-resistant material on the side wall of the cavity neck 40 (i.e., on the upper portion of the side wall, just below the cavity mouth 34).

When the material deposited as the convex layer or protrusion 32 is described as "etch resistant", we mean that the material is resistant to the etchant used in subsequent Step 5 to remove portions of the metal layer 16 to create interconnect lines 18. The choice of material depends on the etchant used in Step 5, which, in turn, depends on the type of metal deposited in Step 4. For example, suppose aluminum is deposited in Step 4, and the aluminum is etched in Step 5 by a conventional chlorine-containing etchant. In that case, suitable etchant-resistant materials would include titanium nitride, a titanium nitride layer deposited over a titanium layer, tantalum, tantalum nitride, or a tantalum nitride layer deposited over a tantalum layer.

Sputtering is a suitable process for depositing the protrusion 32 on the side wall of the cavity neck 40, because many sputtering processes tend to deposit material having an overhang at the cavity neck. In most applications, such overhang is undesirable and the sputtering process is designed to minimize the overhang. However, in the present invention, a controlled amount of overhang is useful to create the protrusion 32.

In our preferred embodiment of the invention, the protrusion 32 and the barrier 21 are composed of the same material and are deposited simultaneously. This enables Step 2 (creating the protrusion 32) and Step 3 (depositing the barrier layer 21) to be performed as a single process step, advantageously reducing the total number of process steps.

In our preferred process for fabricating aluminum plugs and interconnects on a silicon substrate 12, titanium nitride is preferred as the material deposited to form both the protrusion 32 and the barrier 21. Titanium nitride is suitable to form the protrusion 32 because, as mentioned above, it resists etching by the chlorine-based etchants typically used to etch aluminum. Titanium nitride is widely used as a barrier to prevent diffusion of aluminum into underlying silicon, so it is also suitable to form the barrier 21.

Performing Step 2 (creating the protrusion 32) and Step 3 (depositing the barrier layer 21) as a single process step depends on balancing the deposition rates on the cavity neck and cavity bottom so that a protrusion 32 of suitable thickness is deposited at the same time as a barrier layer 21 of suitable thickness. If the ratio between the respective deposition rates on the cavity neck and cavity bottom is too high or too low, then the barrier 21 will be too thin or too thick when a suitably wide protrusion 32 is deposited. Furthermore, an excessive deposition rate on the cavity neck relative to the cavity bottom may grow the protrusion so fast as to block portions of the cavity bottom from coverage by the sputtered material.

In sputter deposition, it is well known that the material being deposited arrives at the semiconductor substrate or workpiece with a distribution of trajectory angles. The ratio between the respective deposition rates on the cavity neck and cavity bottom is proportional to the proportion of the material arriving with trajectories substantially non-perpendicular to the workpiece.

As stated earlier, our preferred material for the protrusion 32 and barrier 21 is titanium nitride. To achieve a suitable ratio between the deposition rates on the cavity neck and bottom, our presently preferred method for sputtering the titanium nitride is conventional ionized sputter deposition using a conventional ECR (electron cyclotron resonator) plasma source. We expect that non-ionized sputtering of titanium nitride would likely deposit too high a proportion of material on the cavity neck. Conversely, we expect that ionized sputter deposition using an inductive plasma source would likely deposit too high a proportion of material on the cavity bottom.

The ratio between the deposition rates on the cavity neck and bottom is also increased by resputtering of material from the cavity bottom onto the cavity neck. In an ionized sputtering process, the resputtering rate can be increased (or decreased) by increasing (or decreasing) the negative DC bias voltage applied to the electrode which supports the workpiece. Therefore, adjusting the bias voltage is one method of adjusting the ratio between the width of the protrusion and the thickness of the barrier. We have observed that the resputtering rate is greater for ECR ionized sputtering than for inductively coupled plasma ionized sputtering of titanium nitride.

The width of the protrusion 32 also will be increased in proportion to the amount of compressive stress in the deposited film. Sputter deposited titanium nitride films have high compressive stress which promotes bulging of the film at corners. The film stress is affected by the temperature of the substrate and the partial pressure of nitrogen gas in the sputter deposition chamber during the deposition process. These parameters can be adjusted to adjust the titanium nitride film stress, and thereby adjust the width of the protrusion 32.

The deposition of etch-resistant material (e.g., TiN) to create the protrusion 32 also deposits a layer 52 of the etch-resistant material on the outer surface 38 of the dielectric 14. Therefore, the structure produced upon completion of process Step 2 is as shown in FIG. 7B rather than FIG. 3B, where the layer 52 is the only difference between these two figures. The metal layer 16 (e.g., aluminum) subsequently deposited in process Step 4 (FIG. 3C) can be deposited directly over the layer 52 of etch-resistant material, creating the structure shown in FIG. 7C.

Next, in process Step 5, the metal layer 16 is patterned to produce the interconnect lines 18 by any conventional patterning process, using an etchant which etches the metal layer 16 at a much higher rate than it etches the etch-resistant material 52. For example, if the metal layer 16 is aluminum and the etch-resistant material 52 is titanium nitride, the metal layer may be patterned using an etchant containing chlorine, which etches aluminum much faster than titanium nitride. Typically, the steps in a metal patterning process are depositing photoresist over the metal layer 16, photolithographically removing the photoresist from areas other than the desired locations of the interconnect lines 18, and then etching the portions of the metal layer which are not covered by photoresist. The result of Step 5 will be the structure shown in FIG. 7D, in which a metal interconnect line 18 overlies and contacts the metal plug 20. The portion 32 of the etch-resistant material which protrudes into the neck 40 of the plug 20 protects the plug from being etched during the metal patterning step, even if the interconnect line is over-etched or slightly misaligned.

Figure 7D:
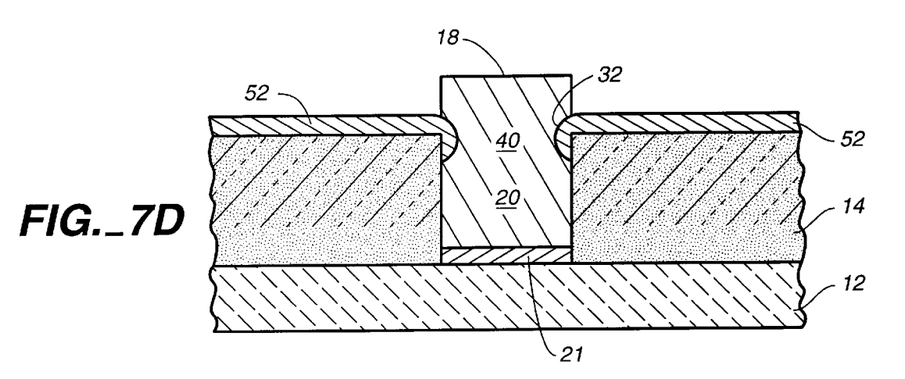
Figure 7E:
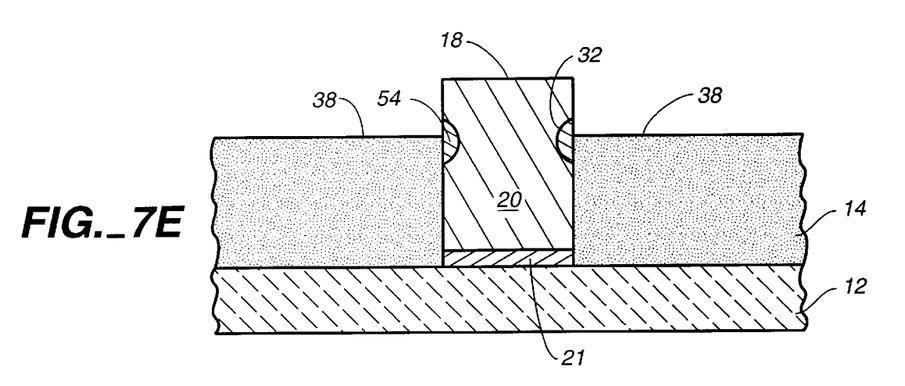

A shown in FIG. 7D, the layer of etch-resistant material 52 remains on the outer surface 38 of the dielectric 14 after the patterning step. This layer 52 can be removed by a subsequent etching step using an etchant which is substantially more active against the etch-resistant material 52 than the metal 18, 20. In the example of an aluminum interconnect 18 and plug 20 and a titanium nitride etch-resistant layer 52, a suitable etchant for removing the etch-resistant layer would be any fluorine-containing etchant commonly used for semiconductor fabrication. Preferably, the etch process should have high vertical directionality (anisotropy), so that the exposed layer 52 is removed without laterally etching the portion 54 (see FIG. 7E) of the protrusion 32 extending above the dielectric 14. Suitable directionality can be achieved with a conventional plasma etch process using negative DC bias on the workpiece. FIG. 7E shows the final structure after removal of the layer 52.

Throughout this patent specification, all references to "metal" materials are intended to include any other material which can be used as an electrical conductor, such as titanium nitride or doped semiconductor material.

What is claimed is:

1. A method of fabricating on a semiconductor workpiece a vertically-extending, electrically conductive plug, comprising the steps of:

depositing on the workpiece a dielectric layer having an outer surface;

creating in the dielectric layer a cavity bounded by a cavity side wall which extends vertically downward from a cavity mouth at the outer surface of the dielectric, wherein the side wall includes an inwardly-extending lateral protrusion near the cavity mouth; and depositing electrically conductive material to fill the cavity, thereby forming a plug;

wherein the step of depositing the dielectric layer further comprises the steps of:

depositing a lower layer of dielectric, and depositing an upper layer of dielectric having a lower etch rate than the lower layer, the upper layer being deposited over the lower layer; and wherein the lower layer of dielectric is deposited with a lower density than the upper layer of dielectric.

2. A method of fabricating an electrically conductive plug on a semiconductor workpiece, comprising the steps of:

depositing on the workpiece a uniform dielectric layer having an outer surface;

creating in the dielectric layer a cavity bounded by a cavity side wall that extends downward from a cavity mouth at the outer surface of the dielectric, wherein the step of creating the cavity further comprises the steps of:

etching in the dielectric layer an upper portion of the cavity using a first, anisotropic etch process which etches the bottom surface of said upper portion faster than the side surface of the upper portion, and then etching in the dielectric layer a lower portion of the cavity using a second etch process which is more isotropic than the first etch process so that the lower portion of the cavity has a greater transverse width than the upper portion of the cavity; and depositing electrically conductive material to fill the cavity.

3. A method according to claim 2, wherein the first etch process deposits a passivation layer on the side surface of the upper portion of the cavity, and wherein the passivation layer impedes etching of the side surface of the upper portion of the cavity during the second etch process.

4. A method of fabricating an electrically conductive plug on a semiconductor workpiece, comprising the steps of:

depositing on the workpiece a dielectric layer having an outer surface;

etching the dielectric layer so as to form a cavity bounded by a cavity side wall that extends downward from a cavity mouth at the outer surface of the dielectric;

depositing an etchant-resistant material on the wall of the cavity adjacent the cavity mouth so as to form an inwardly-extending lateral protrusion, the etchant-resistant material being resistant to etching by at least one etchant substance which etches said electrically conductive material substantially faster than it etches the etchant resistant material; and depositing electrically conductive material to fill the cavity.

5. A method according to claim 4, wherein the electrically conductive material is aluminum and the etchant-resistant material is selected from the group consisting of titanium nitride, a titanium nitride layer deposited over a titanium layer, tantalum, tantalum nitride, and a tantalum nitride layer deposited over a tantalum layer.

6. A method according to claim 4, wherein the step of depositing the etchant-resistant material comprises electron cyclotron resonance ionized sputter deposition of the etchant-resistant material.

7. A method according to claim 6, wherein the etchant-resistant material is titanium nitride.

8. A method according to claim 4, wherein the electrically conductive material filling the cavity is termed a plug, and wherein the method further comprises the subsequent steps of:

depositing a layer of electrically conductive material onto the outer surface of the dielectric and onto the plug; and etching a portion of the conductive layer on two opposing sides of the cavity mouth so as to leave un-etched a horizontally-extending interconnect conductor connecting to the metal plug;

wherein the inward extension of the protrusion is sufficient to prevent the step of etching the conductive layer from also etching the plug beyond the protrusion.

9. A method according to claim 8, wherein:

the interconnect is laterally bounded by first and second lateral edges; and the creating step further includes creating the protrusion with a lateral width greater than or equal to the maximum likely cumulative error in the position of either of the interconnect edges relative to the cavity mouth.

10. A method according to claim 8, wherein the electrically conductive material is metal.

11. A method according to claim 10, wherein the metal is aluminum.

12. A method according to claim 4, wherein the etchant-resistant material has a chemical composition different from the dielectric layer.

13. A method according to claim 4, wherein the etchant-resistant material is not a dielectric.

14. A method according to claim 4, wherein:

the step of depositing the etchant-resistant material further comprises depositing the etchant-resistant material on the bottom of the cavity; and the step of depositing conductive material further comprises depositing said conductive material over the etch-resistant material on the bottom of the cavity.

15. A method according to claim 14, wherein the etch-resistant material is a barrier to diffusion of the conductive material.

16. A method according to claim 14, wherein the etch-resistant material is deposited simultaneously on the bottom of the cavity and on the wall of the cavity adjacent the cavity mouth.

17. A method of fabricating an electrically conductive plug on a semiconductor workpiece, comprising the steps of:

depositing on the workpiece a lower layer of dielectric;

depositing over the lower layer an upper layer of dielectric having an upper surface, wherein the upper layer has a higher density than the lower layer;

concurrently etching the upper and lower dielectric layers, wherein the higher density upper layer etches more slowly than the lower layer so as to form in the dielectric a cavity having an upper portion and a lower portion such that the upper portion is narrower than the lower portion; and depositing electrically conductive material to fill the cavity.

* * * * *